US011436856B2

(12) United States Patent
Liu et al.

(10) Patent No.: US 11,436,856 B2
(45) Date of Patent: Sep. 6, 2022

(54) METHOD FOR MANUFACTURING FINGERPRINT RECOGNITION MODULE, FINGERPRINT RECOGNITION MODULE, AND DISPLAY DEVICE

(71) Applicant: BOE Technology Group Co., Ltd., Beijing (CN)

(72) Inventors: Wenqu Liu, Beijing (CN); Qi Yao, Beijing (CN); Feng Zhang, Beijing (CN); Zhijun Lv, Beijing (CN); Liwen Dong, Beijing (CN); Xiaoxin Song, Beijing (CN); Zhao Cui, Beijing (CN); Detian Meng, Beijing (CN); Libo Wang, Beijing (CN); Mingqi Chen, Beijing (CN); Changzheng Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 346 days.

(21) Appl. No.: 16/826,196

(22) Filed: Mar. 21, 2020

(65) Prior Publication Data
US 2021/0089739 A1    Mar. 25, 2021

(30) Foreign Application Priority Data
Sep. 24, 2019    (CN) .......................... 201910903503.2

(51) Int. Cl.
*H01L 41/04*    (2006.01)
*G06V 40/13*    (2022.01)
(Continued)

(52) U.S. Cl.
CPC ........ *G06V 40/1306* (2022.01); *B06B 1/0688* (2013.01); *H01L 41/0825* (2013.01);
(Continued)

(58) Field of Classification Search
None
See application file for complete search history.

(56) References Cited

U.S. PATENT DOCUMENTS

2012/0112604 A1\*  5/2012  Hasegawa ............... H01L 41/31
                                                  310/326
2015/0158053 A1\*  6/2015  Lee ....................... H01L 41/319
                                                  156/701
(Continued)

*Primary Examiner* — Benjamin P Sandvik
(74) *Attorney, Agent, or Firm* — ArentFox Schiff LLP; Michael Fainberg

(57) ABSTRACT

Embodiments of the present disclosure provide a method for manufacturing a fingerprint recognition method, a fingerprint recognition module, and a display device. The method for manufacturing the fingerprint recognition module includes: providing a backplane; forming a bonding terminal in a bonding area of the backplane; forming a sensing electrode in a fingerprint recognition area of the backplane; forming an insulation layer cladding the bonding terminal in the bonding area, and forming a piezoelectric material layer in the fingerprint recognition area, where an orthographic projection of the piezoelectric material layer on the backplane coincides with an orthographic projection of the sensing electrode on the backplane; performing polarization processing on the piezoelectric material layer; and peeling off the insulation layer.

13 Claims, 4 Drawing Sheets

(51) Int. Cl.
*H01L 41/08* (2006.01)
*H01L 41/193* (2006.01)
*B06B 1/06* (2006.01)
*H01L 41/29* (2013.01)
*H01L 41/331* (2013.01)
*H01L 41/45* (2013.01)
*H01L 41/257* (2013.01)

(52) U.S. Cl.
CPC .......... *H01L 41/193* (2013.01); *H01L 41/257* (2013.01); *H01L 41/29* (2013.01); *H01L 41/331* (2013.01); *H01L 41/45* (2013.01); *Y10T 29/42* (2015.01)

(56) References Cited

U.S. PATENT DOCUMENTS

| 2021/0151522 A1* | 5/2021 | Qi ..................... G06V 40/1306 |
| 2021/0167274 A1* | 6/2021 | Zhang ................ H01L 41/0477 |

* cited by examiner

METHOD FOR MANUFACTURING FINGERPRINT RECOGNITION MODULE, FINGERPRINT RECOGNITION MODULE, AND DISPLAY DEVICE

The present application claims priority to Chinese Patent Application No. 201910903503.2 filed with the Chinese Patent Office on Sep. 24, 2019, which is hereby incorporated by reference in its entirety.

FIELD

The present disclosure relates to the technical field of fingerprint recognition, and in particular to a method for manufacturing a fingerprint recognition module, a fingerprint recognition module, and a display device.

BACKGROUND

With continuous development of science and technology, a fingerprint recognition technology has gradually been applied to people's daily life. In the fingerprint recognition technology, identification can be performed by comparing detailed feature points of different fingerprints, to achieve a function of identity recognition. Generally, the fingerprint recognition technology can include an optical fingerprint recognition technology, a silicon chip fingerprint recognition technology, and an ultrasonic fingerprint recognition technology.

Currently, the ultrasonic fingerprint recognition technology is a popular research direction of major manufacturers. An ultrasonic fingerprint recognition module is mainly of a three-overlapping-layer structure, including a driving electrode, a sensing electrode, and a piezoelectric material layer located between the driving electrode and the sensing electrode. When an Alternating Current (AC) voltage is applied to the driving electrode, the piezoelectric material layer will deform under the condition that a reverse piezoelectric effect exists and transmit first ultrasonic waves. After the first ultrasonic waves are transmitted to a finger, second ultrasonic waves are reflected by the finger. Because fingerprint includes valleys and ridges, there are differences in vibration intensity of the second ultrasonic waves reflected by the fingerprint back to the piezoelectric material layer, and the piezoelectric material layer will convert the second ultrasonic waves with the differences into different electrical signals under the condition that a forward piezoelectric effect exists, so that positions of the valleys and the ridges can be identified.

SUMMARY

A method for manufacturing a fingerprint recognition module provided by an embodiment of the present disclosure includes:
providing a backplane;
forming a bonding terminal in a bonding area of the backplane;
forming a sensing electrode in a fingerprint recognition area of the backplane;
forming an insulation layer cladding the bonding terminal in the bonding area, and forming a piezoelectric material layer in the fingerprint recognition area, where an orthographic projection of the piezoelectric material layer on the backplane coincides with an orthographic projection of the sensing electrode on the backplane;
performing polarization processing on the piezoelectric material layer; and
peeling off the insulation layer.

In a possible implementation, in the above method provided by the embodiment of the present disclosure, the forming the insulation layer cladding the bonding terminal in the bonding area includes:
forming an organic insulation layer cladding the bonding terminal in a coating manner, where a gap exists between the organic insulation layer and the sensing electrode.

In a possible implementation, in the method provided by the embodiment of the present disclosure, a material of the organic insulation layer is polyimide.

In a possible implementation, in the method provided by the embodiment of the present disclosure, the peeling off the insulation layer includes:
peeling off the polyimide by using laser cutting.

In a possible implementation, in the method provided by the embodiment of the present disclosure, the forming the insulation layer cladding the bonding terminal in the bonding area includes:
forming an organic insulation layer cladding the bonding terminal in a coating manner, where the organic insulation layer is in contact with the sensing electrode.

In a possible implementation, in the method provided by the embodiment of the present disclosure, a material of the organic insulation layer is photoresist.

In a possible implementation, in the method provided by the embodiment of the present disclosure, the peeling off the insulation layer includes:
peeling off the photoresist by using a stripper.

In a possible implementation, in the method provided by the embodiment of the present disclosure, the piezoelectric material layer is formed in the fingerprint recognition area before the insulation layer cladding the bonding terminal is formed in the bonding area; or the piezoelectric material layer is formed in the fingerprint recognition area after the insulation layer cladding the bonding terminal is formed in the bonding area.

In a possible implementation, in the method provided by the embodiment of the present disclosure, a thickness of the insulation layer on the bonding terminal is greater than 4 μm.

In a possible implementation, in the method provided by the embodiment of the present disclosure, a polarization terminal is formed in a polarization area of the backplane, and when the polarization processing is performed on the piezoelectric material layer, the method further includes:
grounding the polarization terminal.

In a possible implementation, in the method provided by the embodiment of the present disclosure, after the insulation layer is peeled off, the method further includes:
forming a driving electrode on the piezoelectric material layer.

Based on the same inventive concept, an embodiment of the present disclosure further provides a fingerprint recognition module, and the fingerprint recognition module is manufactured by using the above method.

Based on the same inventive concept, an embodiment of the present disclosure further provides a display device, including the above fingerprint recognition module.

DETAILED DESCRIPTION OF THE EMBODIMENTS

To make the objectives, technical solutions, and advantages of the embodiments of the present disclosure clearer, the technical solutions of the embodiments of the present disclosure are clearly and completely described below in combination with accompanying drawings of the embodiments of the present disclosure. Obviously, the described embodiments are some embodiments of the present disclosure, but not all the embodiments. Based on the described embodiments of the present disclosure, all other embodiments obtained by those ordinarily skilled in the art without creative efforts shall fall within the protection scope of the present disclosure.

Unless otherwise defined, the technical or scientific terms used herein shall have the ordinary meanings understood by the person with ordinary skills in the field to which the present disclosure belongs. The words such as "first" and "second" used in the specification and claims of the present disclosure do not indicate any order, quantity, or importance, but are only used to distinguish different components. The word such as "comprise" or "include" means that the element or item appearing before the word covers the element or item appearing after the word and the equivalent thereof without excluding other elements or items. The words such as "inside", "outside", "upward", and "downward" are only used to indicate relative positional relationships. When an absolute position of a described object changes, the relative positional relationship may also change correspondingly.

In the related art, electric polarization processing needs to be performed on a piezoelectric material layer, so that a good piezoelectric effect can be obtained. A polarization objective is to allow randomly oriented molecular dipole electric moments in the piezoelectric material layer to be uniformly oriented in a specific direction (that is, a direction of a polarization electric field), so that piezoelectricity of a piezoelectric material layer is improved. For electric polarization, a non-uniform electric field is used to cause corona discharge due to local breakdown of air, to produce an ion beam that bombards dielectric and cause an ionic charge to be deposited in the dielectric, so that a better polarization effect is achieved.

Figure 1:
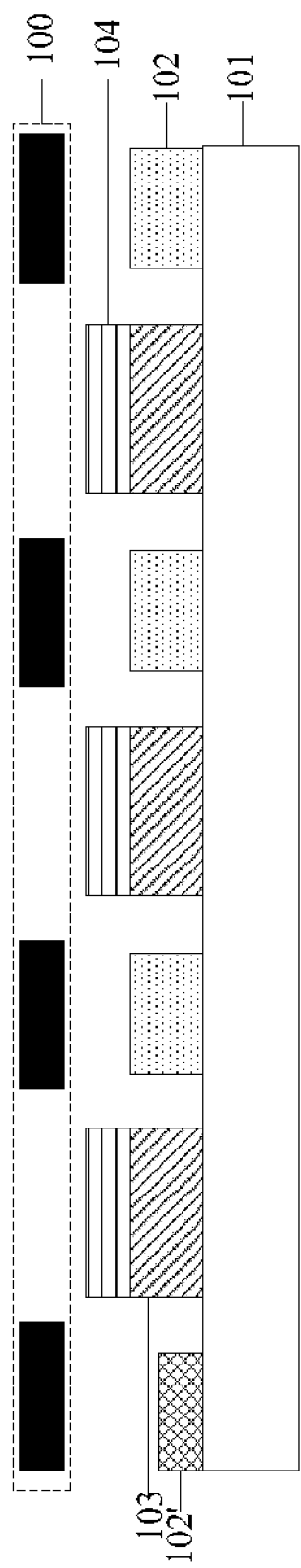
FIG. 1 is a schematic diagram of performing polarization on a piezoelectric material layer in the related art.

As shown in FIG. 1, a backplane 101 of an ultrasonic fingerprint recognition module in the related art includes a fingerprint recognition (AA) area and a bonding area. A metal bonding terminal 102 (Bonding PAD) in the bonding area is exposed, to be linked with a chip (IC) or a flexible printed circuit (FPC). A sensing electrode 103 and a piezoelectric material layer 104 located on the sensing electrode 103 are arranged in the fingerprint recognition area. If polarization is performed on the piezoelectric material layer 104, a polarization electric field is in direct contact with the bonding terminal 102, an electron cloud (Plasma) flows away along the bonding terminal 102 and even breaks down the backplane 101. In order to implement a better polarization effect, polarization is performed by using a shadow mask 100 in the related art. As shown in FIG. 1, a hollowed-out area of the shadow mask 100 corresponds to the piezoelectric material layer 104, and a shielding area corresponds to the bonding terminal 102, so that the polarization electric field is effectively isolated from the bonding terminal 102 by the shadow mask 100 in a polarization process. At the same time, the shielding area also corresponds to a polarization terminal 102', and the polarization terminal 102' is grounded in the polarization process, to ensure that the sensing electrode 103 electrically connected to the polarization terminal 102' under the piezoelectric material layer 104 is at zero potential. In this way, a potential difference is formed between a surface of the piezoelectric material layer 104 in contact with the sensing electrode 103 and a surface of the piezoelectric material layer 104 in contact with the polarization electric field, so that polarization of the piezoelectric material layer 104 is achieved.

However, the shadow mask 100 needs to be made from a non-metallic material, as a result, there are technical problems that it is impossible to implement a large size and is difficult to process, and in addition, the hollowed-out area of the shadow mask 100 is made by mechanical treatment, and therefore cannot be accurately aligned with the fingerprint recognition area.

In order to solve the above technical problems in the related art, the embodiments of the present disclosure provide a method for manufacturing a fingerprint recognition module, a fingerprint recognition module, and a display device.

Figure 2:
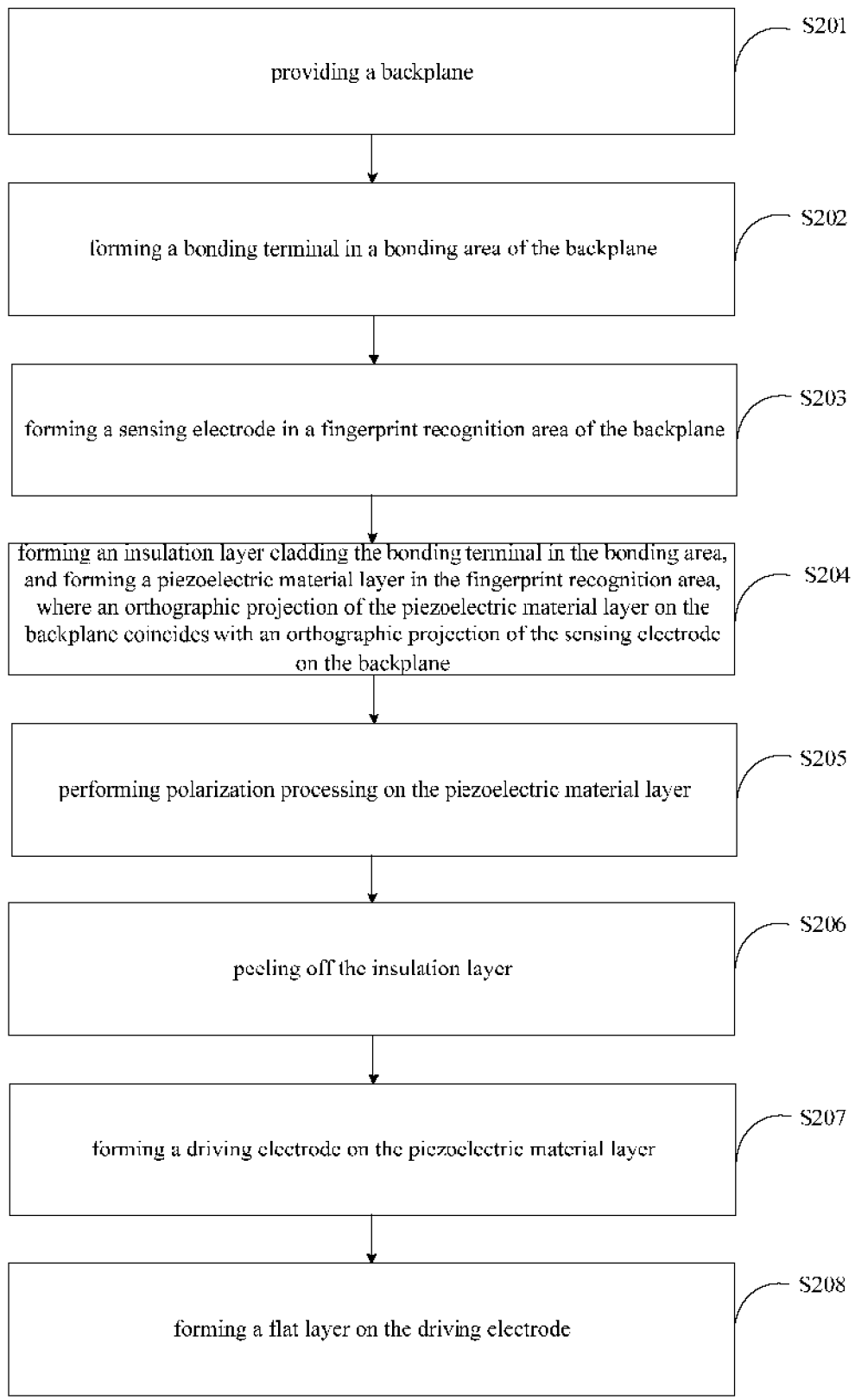
FIG. 2 is a flowchart of a method for manufacturing a fingerprint recognition module provided by an embodiment of the present disclosure.

Optionally, as shown in FIG. 2, a method for manufacturing a fingerprint recognition module provided by an embodiment of the present disclosure may include the following operations:

S201. providing a backplane;

S202. forming a bonding terminal in a bonding area of the backplane;

S203. forming a sensing electrode in a fingerprint recognition area of the backplane;

S204. forming an insulation layer cladding the bonding terminal in the bonding area,
and forming a piezoelectric material layer in the fingerprint recognition area, where an orthographic projection of the piezoelectric material layer on the backplane coincides with an orthographic projection of the sensing electrode on the backplane;

S205. performing polarization processing on the piezoelectric material layer which may be a polyvinylidene fluoride (PVDF) film or the like; and S206. peeling off the insulation layer.

In the method for manufacturing the fingerprint recognition module provided by the embodiment of the present disclosure, the insulation layer cladding the bonding terminal is formed in the bonding area, so that a polarization electric field can be isolated from the bonding terminal by using the insulation layer in a subsequent polarization process for the piezoelectric material layer. In this way, the shadow mask used to isolate the polarization electric field from the bonding terminal in the related art can be omitted, so that accurate alignment and large-scale polarization can be realized in the polarization process.

Optionally, in the method provided by the embodiment of the present disclosure, S204 of forming an insulation layer cladding the bonding terminal in the bonding area can be specifically implemented in the following two possible manners.

A first possible implementation manner is as follows: the organic insulation layer cladding the bonding terminal is formed in a coating manner, and a gap exists between the organic insulation layer and the sensing electrode.

Optionally, a material of the organic insulation layer is polyimide. Correspondingly, in order to avoid damage to the piezoelectric material layer in a process of peeling off the insulation layer, S206 of peeling off the insulation layer may specifically include:

peeling off the polyimide by using laser cutting.

A second possible implementation manner is as follows: the organic insulation layer cladding the bonding terminal is formed in a coating manner, and the organic insulation layer is in contact with the sensing electrode.

Optionally, a material of the organic insulation layer is photoresist. Correspondingly, S206 of peeling off the insulation layer may specifically include:

peeling off the photoresist by using a stripper.

Optionally, in the method provided by the embodiment of the present disclosure, in S204, the piezoelectric material layer may be formed in the fingerprint recognition area before the insulation layer cladding the bonding terminal is formed in the bonding area; or the piezoelectric material layer may be formed in the fingerprint recognition area after the insulation layer cladding the bonding terminal is formed in the bonding area, which is not limited herein.

Optionally, in order to effectively isolate the polarization electric field, in the method provided by the embodiment of the present disclosure, a thickness of the insulation layer on the bonding terminal is greater than 4 µm. Limited by the thickness of the insulation layer, insulation layers involved in the above manufacturing method are organic insulation layers.

Optionally, a polarization terminal is further formed in a polarization area of the backplane. In the manufacturing method provided by the embodiment of the present disclosure, while S205 of performing polarization processing on the piezoelectric material layer is performed, the following operation needs to be performed: The polarization terminal is grounded to ensure that the sensing electrode electrically connected to the polarization terminal under the piezoelectric material layer is at zero potential, so that a potential difference is formed between a surface of the piezoelectric material layer in contact with the sensing electrode and a surface of the piezoelectric material layer in contact with the polarization electric field, and therefore polarization of the piezoelectric material layer is realized.

Optionally, in the manufacturing method provided by the embodiment of the present disclosure, after S206 of peeling off the insulation layer is performed, S207 of forming a driving electrode on the piezoelectric material layer may further be performed.

Optionally, in the manufacturing method provided by the embodiment of the present disclosure, after S207 of forming a driving electrode on the piezoelectric material layer is performed, S208 of forming a flat layer on the driving electrode may be further performed.

In order to better understand the technical solution of the manufacturing method provided by the embodiments of the present disclosure, two possible embodiments are described below.

Embodiment 1

Figure 3:
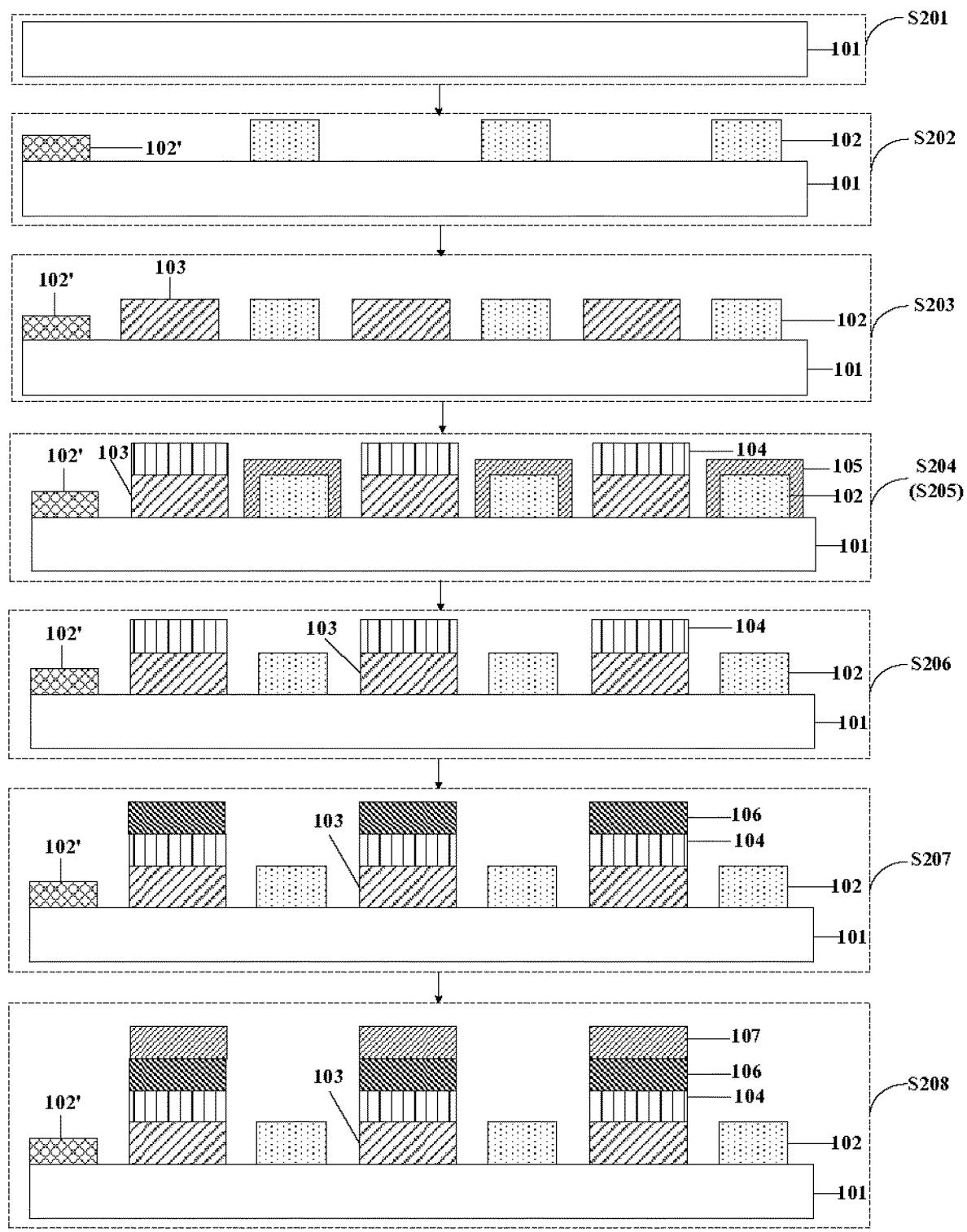
FIG. 3 is a structural schematic diagram of a fingerprint recognition module, manufactured after respective operations of the method, provided by an embodiment of the present disclosure.

As shown in FIG. 3, FIG. 3 is a structural schematic diagram of a fingerprint recognition module manufactured after respective operations of the method provided by Embodiment 1 of the present disclosure. Optionally, the manufacturing process is as follows.

a backplane 101 is provided; and in an actual manufacturing process, 11 shadow mask processes such as p-Si, $P-V_{th}$, $N-V_{th}$, $PIN\ V_{th}$, P-Gate, N-Gate, ILD, SD, PLN, ITO, and PVX are performed on a substrate to obtain the backplane 101. A bonding terminal 102 located in a bonding area and a polarization terminal 102' located in a polarization area are manufactured simultaneously with SD, an ITO layer is a layer on which a sensing electrode 103 in a fingerprint recognition area is located, and the polarization terminal 102' is electrically connected to the sensing electrode 103;

a piezoelectric material layer 104 is formed in the fingerprint recognition area, where an orthographic projection of the piezoelectric material layer 104 coincides with an orthographic projection of the sensing electrode 103; an organic insulation layer 105 cladding the bonding terminal 102 is formed in a coating manner, when a material of the organic insulation layer 105 is an organic material that is not easily peeled off, such as polyimide, a gap needs to be set between the organic insulation layer 105 and the sensing electrode 103, to avoid damage to the piezoelectric material layer 104 in a subsequent process of peeling off the organic insulation layer 105 by using laser cutting; and optionally, in order to effectively isolate a polarization electric field, a thickness of the organic insulation layer 105 located on the bonding terminal 102 is greater than 4 µm. It is worth noting that in the step, the piezoelectric material layer 104 may be formed in the fingerprint recognition area before the organic insulation layer 105 cladding the bonding terminal 102 is formed in the bonding area; or the piezoelectric material layer 104 may be formed in the fingerprint recognition area after the organic insulation layer 105 cladding the bonding terminal 102 is formed in the bonding area, which is not limited herein;

polarization processing is performed on the piezoelectric material layer 104, and the polarization terminal 102' is grounded at the same time; and optionally, a polarization device is provided with a plurality of fixed grounding terminals (Pad), and when a polarization stage (Stage) is entered, the grounding terminals are connected to the polarization terminal 102' on the backplane 101 by using mechanical movement, so that the polarization terminal 102' is grounded to ensure that the sensing electrode 103 under the piezoelectric material layer 104 is at zero potential, further, a potential difference is formed between a surface of the piezoelectric layer 104 in contact with the sensing electrode 103 and a surface of the piezoelectric material layer 104 in contact with the polarization electric field, and therefore polarization of the piezoelectric material layer 104 is implemented;

the organic insulation layer 105 made of polyimide is peeled off by using laser cutting.

a driving electrode 106 is formed on the piezoelectric material layer 104, and optionally, the driving electrode 106 may be formed by using Ag silk printing; and a flat layer 107 is formed on the driving electrode 106.

Embodiment 2

Figure 4:
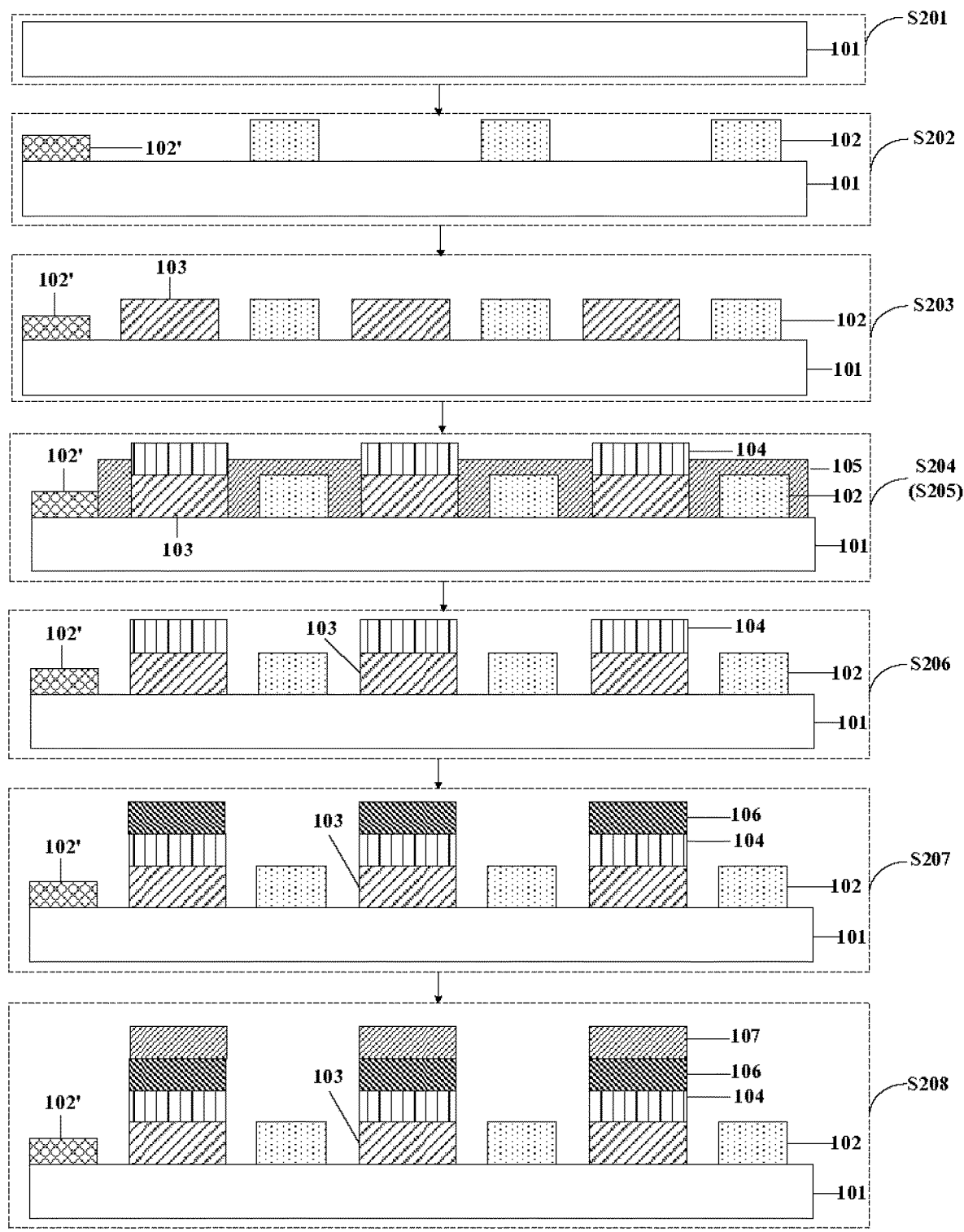
FIG. 4 is a structural schematic diagram of a fingerprint recognition module, manufactured after respective operations of the method, provided by another embodiment of the present disclosure.

As shown in FIG. 4, FIG. 4 is a schematic structural diagram of a fingerprint recognition module manufactured after respective operations of the method provided by Embodiment 2 of the present disclosure. Optionally, the manufacturing process is as follows.

a backplane 101 is provided; and in an actual manufacturing process, 11 shadow mask processes such as p-Si, P-$V_{th}$, N-$V_{th}$, PIN $V_{th}$, P-Gate, N-Gate, ILD, SD, PLN, ITO, and PVX are performed on a substrate to obtain the backplane 101, where a bonding terminal 102 located in a bonding area and a polarization terminal 102' located in a polarization area are manufactured simultaneously with SD, and an ITO layer is a layer on which a sensing electrode 103 in a fingerprint recognition area is located, and the polarization terminal 102' is electrically connected to the sensing electrode 103;

a piezoelectric material layer 104 is formed in the fingerprint recognition area, where an orthographic projection of the piezoelectric material layer 104 coincides with an orthographic projection of the sensing electrode 103; an organic insulation layer 105 cladding the bonding terminal 102 is formed in a coating manner, and when a material of the organic insulation layer 105 is an organic material that is easily peeled off, such as photoresist, the organic insulation layer 105 can be in contact with the sensing electrode 103; in this way, on the one hand, it is easy to manufacture, and on the other hand, no damage to the piezoelectric material layer 104 is caused in a subsequent process of peeling off the insulation layer 105 by using a stripper; and optionally, in order to effectively isolate a polarization electric field, a thickness of the organic insulation layer 105 located on the bonding terminal 102 is greater than 4 µm. It is worth noting that in the step, the piezoelectric material layer 104 may be formed in the fingerprint recognition area before the organic insulation layer 105 cladding the bonding terminal 102 is formed in the bonding area; or the piezoelectric material layer 104 may be formed in the fingerprint recognition area after the organic insulation layer 105 cladding the bonding terminal 102 is formed in the bonding area, which is not limited herein;

polarization processing is performed on the piezoelectric material layer 104, and the polarization terminal 102' is grounded at the same time; optionally, a polarization device is provided with a plurality of fixed grounding terminals (Pad), and when a polarization stage (Stage) is entered, the grounding terminals are connected to the polarization terminal 102' on the backplane 101 by using mechanical movement, so that the polarization terminal 102' is grounded to ensure that the sensing electrode 103 under the piezoelectric material layer 104 is at zero potential, further, a potential difference is formed between a surface of the piezoelectric layer 104 in contact with the sensing electrode 103 and a surface of the piezoelectric material layer 104 in contact with the polarization electric field, and therefore polarization of the piezoelectric material layer 104 is realized;

the organic insulation layer 105 made of photoresist is peeled off by using a stripper;

a driving electrode 106 is formed on the piezoelectric material layer 104, and optionally, the driving electrode 106 may be formed by using Ag silk printing; and a flat layer 107 is formed on the driving electrode 106.

It should be noted that, in the above manufacturing method provided by the embodiments of the present disclosure, a patterning process involved in forming each layer structure may not only include some or all processes such as deposition, photoresist coating, shadow mask masking, exposure, development, etching, and photoresist peeling, or may also include other processes. The specific process is based on the formation of the required pattern in the actual manufacturing process, which is not limited herein. For example, a post-baking process may also be included after development and before etching.

The deposition process may be a chemical vapor deposition method, a plasma enhanced chemical vapor deposition method, or a physical vapor deposition method, which is not limited herein. The shadow mask used in the masking process may be a half tone mask (Half Tone Mask), a single slit diffraction mask (Single Slit Mask), or a gray tone mask (Gray Tone Mask), which is not limited herein. Etching can be dry etching or wet etching, which is not limited herein.

Based on the same inventive concept, an embodiment of the present disclosure provides a fingerprint recognition module. The principle of the fingerprint recognition module for solving problems is similar to the principle of the above manufacturing method for solving problems. Therefore, the implementation of the fingerprint recognition module provided by the embodiment of the present disclosure may refer to the implementation of the above manufacturing method provided by the embodiment of the present disclosure, and repeated parts are not described herein.

Based on the same inventive concept, an embodiment of the present disclosure further provides a display device, including the above fingerprint recognition module provided by the embodiment of the present disclosure. The display device may be any product or component having a display function, such as a mobile phone, a tablet computer, a television, a display, a notebook computer, a digital photo frame, a navigator, a smart watch, a witness wristband, a personal digital assistant. The principle of the display device for solving problems is similar to the principle of the fingerprint recognition module for solving problems. Therefore, the implementation of the display device may refer to the embodiment of the fingerprint recognition module, and repeated parts are not described herein.

The embodiments of the present disclosure provide a method for manufacturing a fingerprint recognition module, a fingerprint recognition module, and a display device. The method for manufacturing the fingerprint recognition module includes: providing a backplane; forming a bonding terminal in a bonding area of the backplane; forming a sensing electrode in a fingerprint recognition area of the backplane; forming an insulation layer cladding the bonding terminal in the bonding area, and forming a piezoelectric material layer in the fingerprint recognition area, where an orthographic projection of the piezoelectric material layer on the backplane coincides with an orthographic projection of the sensing electrode on the backplane; performing polarization processing on the piezoelectric material layer; and peeling off the insulation layer. The insulation layer cladding the bonding terminal is formed in the bonding area, so that a polarization electric field can be isolated from the bonding terminal by using the insulation layer in a subsequent polarization process for the piezoelectric material layer. In this way, a shadow mask in the related art used to isolate the polarization electric field from the bonding terminal can be omitted, so that accurate alignment and large-scale polarization can be implemented in the polarization process.

Obviously, those skilled in the art can make various modifications and variations to the present disclosure without departing from the spirit and scope of the present disclosure. In this way, if the modifications and variations of the present disclosure fall within the scope of claims of the present disclosure and equivalent technologies thereof, the present disclosure also intends to include the modifications and variations.

What is claimed is:

1. A method for manufacturing a fingerprint recognition module, comprising:
    providing a backplane;
    forming a bonding terminal in a bonding area of the backplane;
    forming a sensing electrode in a fingerprint recognition area of the backplane;
    forming an insulation layer cladding the bonding terminal in the bonding area, and forming a piezoelectric material layer in the fingerprint recognition area, wherein an orthographic projection of the piezoelectric material layer on the backplane coincides with an orthographic projection of the sensing electrode on the backplane;
    performing polarization processing on the piezoelectric material layer; and
    peeling off the insulation layer.

2. The method of claim 1, wherein the forming the insulation layer cladding the binding terminal in the bonding area comprises:
    forming an organic insulation layer cladding the bonding terminal in a coating manner, wherein a gap exists between the organic insulation layer and the sensing electrode.

3. The method of claim 2, wherein a material of the organic insulation layer is polyimide.

4. The method of claim 3, wherein the peeling off the insulation layer comprises:
    peeling off the polyimide by using laser cutting.

5. The method of claim 1, wherein the forming the insulation layer cladding the bonding terminal in the bonding area comprises:
    forming an organic insulation layer cladding the bonding terminal in a coating manner, wherein the organic insulation layer is in contact with the sensing electrode.

6. The method of claim 5, wherein a material of the organic insulation layer is photoresist.

7. The method of claim 6, wherein the peeling off the insulation layer comprises:
    peeling off the photoresist by using a stripper.

8. The method of claim 1, wherein the piezoelectric material layer is formed in the fingerprint recognition area before the insulation layer cladding the bonding terminal is formed in the bonding area; or the piezoelectric material layer is formed in the fingerprint recognition area after the insulation layer cladding the bonding terminal is formed in the bonding area.

9. The method of claim 1, wherein a thickness of the insulation layer on the bonding terminal is greater than 4 μm.

10. The method of claim 1, wherein a polarization terminal is formed in a polarization area of the backplane, and while the polarization processing is performed on the piezoelectric material layer, the method further comprises:
    grounding the polarization terminal.

11. The method of claim 1, wherein after the insulation layer is peeled off, the method further comprises:
    forming a driving electrode on the piezoelectric material layer.

12. A fingerprint recognition module, wherein the fingerprint recognition module is manufactured by using the method of claim 1.

13. A display device, comprising the fingerprint recognition module of claim 12.

* * * * *